United States Patent
Jeon et al.

(10) Patent No.: US 7,916,538 B2
(45) Date of Patent: Mar. 29, 2011

(54) MEMORY DEVICE EMPLOYING NVRAM AND FLASH MEMORY CELLS

(75) Inventors: Byung-gil Jeon, Gyeonggi-do (KR); Byung-jun Min, Gyeonggi-do (KR); Hong-sik Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 154 days.

(21) Appl. No.: 12/337,950

(22) Filed: Dec. 18, 2008

(65) Prior Publication Data

US 2009/0190401 A1 Jul. 30, 2009

(30) Foreign Application Priority Data

Jan. 28, 2008 (KR) .......... 10-2008-0008731

(51) Int. Cl.
*G11C 16/04* (2006.01)
(52) U.S. Cl. ......... 365/185.05; 365/189.05; 365/230.06; 365/185.18; 365/185.11; 365/185.12; 365/185.23; 365/132; 365/189.2
(58) Field of Classification Search .......... 365/185.05, 365/189.05, 230.06, 185.18, 185.11, 185.12, 365/185.23, 132, 189.2
See application file for complete search history.

(56) References Cited

U.S. PATENT DOCUMENTS

| 7,079,408 | B2 * | 7/2006 | McAdams | ............ 365/49.1 |
| 7,353,324 | B2 * | 4/2008 | Tanaka | ............ 711/103 |
| 2006/0176726 | A1 | 8/2006 | Bhattacharyya et al. | |
| 2008/0229161 | A1 * | 9/2008 | Lee et al. | ............ 714/710 |

FOREIGN PATENT DOCUMENTS

| JP | 2001-274355 | 10/2001 |
| KR | 1020060090088 A | 8/2006 |

* cited by examiner

*Primary Examiner* — Hoai V Ho
*Assistant Examiner* — Fernando N Hidalgo
(74) *Attorney, Agent, or Firm* — Myers Bigel Sibley & Sajovec, P.A.

(57) ABSTRACT

A memory device includes a memory cell array including a NAND flash cell portion including a plurality of first columns of serially-connected flash memory cells and a non-volatile random access memory (NVRAM) cell portion including a plurality of second columns of NVRAM cells. The flash memory cells and the NVRAM cells are arranged such that respective word lines are connected to flash memory cells and NVRAM cells in each of respective rows, which may correspond to page units including flash memory cells and NVRAM cells.

15 Claims, 5 Drawing Sheets

SMALL BLOCK PAGE CONFIGURATION

FIG. 2B (PRIOR ART)

LARGE BLOCK PAGE CONFIGURATION

FIG. 5

MEMORY DEVICE EMPLOYING NVRAM AND FLASH MEMORY CELLS

CROSS-REFERENCE TO RELATED PATENT APPLICATION

This application claims the benefit of Korean Patent Application No. 10-2008-0008731, filed on Jan. 28, 2008, in the Korean Intellectual Property Office, the disclosure of which is incorporated herein in its entirety by reference.

FIELD OF THE INVENTION

The present invention relates to memory devices, and more particularly, to NAND flash memory devices.

BACKGROUND OF THE INVENTION

Flash memory devices typically program and erase data by using a tunneling phenomenon. Flash memory devices may be suitable for use as storage devices in portable media devices, because of their generally excellent data integrity, low power consumption, and strong durability from an external impact.

NAND flash memory devices, in which memory cells are connected in series, may provide superior integration because the size of the memory cells may be kept relatively small as compared to NOR flash memory devices, in which memory cells are connected in parallel. Thus, NAND flash memory devices may be more useful as mass storage devices. The storage capacity of NAND flash memory devices has increased to tens of gigabytes (Gb).

Figure 1:
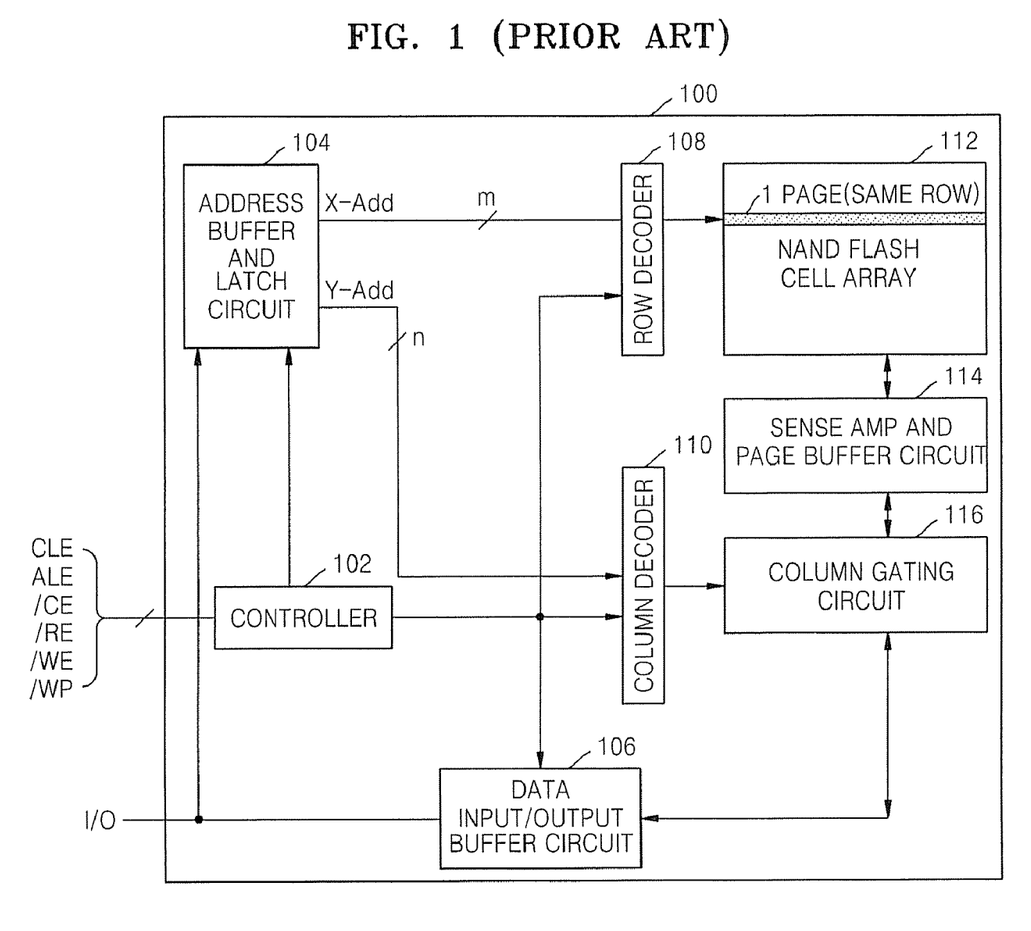
FIG. 1 is a block diagram illustrating a conventional NAND flash memory device.

FIG. 1 is a block diagram illustrating a conventional NAND flash memory device 100. Referring to FIG. 1, the conventional NAND flash memory device 100 includes a controller 102, an address buffer circuit and latch circuit 104, a data input/output buffer circuit 106, a row decoder circuit 108, a column decoder circuit 110, a memory cell array 112, a sense amplifier and page buffer circuit 114, and a column gating circuit 116.

The controller 102 receives a plurality of control signals CLE, ALE, /CE, /RE, /WE, and /WP so as to generate mode control signals for controlling operations, such as a programming operation, an erasing operation and a reading operation of the conventional NAND flash memory device 100. In response to the mode control signals of the controller 102, the address buffer circuit and latch circuit 104 provides row addresses X-Add and column addresses Y-Add received through respective data input/output pins I/O to the row decoder circuit 108 and the column decoder circuit 110.

In response to the mode control signals of the controller 102, the row decoder circuit 108 selects a wordline of the memory cell array 112 by decoding the row addresses X-Add, and operates the selected wordline forming one string and the unselected wordlines, by applying a program voltage Vpgm, an erase voltage Verase, a read voltage Vread, or a pass voltage Vpass according to the programming operation, the erasing operation, or the reading operation. In response to the mode control signals of the controller 102, the column decoder circuit 110 decodes the column addresses Y-Add and transmits the decoded column addresses Y-Add to the column gating circuit 116.

During the reading operation, the sense amplifier and page buffer circuit 114 sense amplifies data of bitlines in a page including memory cells connected to the selected wordline of the memory cell array 112, and transmits the sense amplified data to the data input/output buffer circuit 106. During the programming operation, the sense amplifier and page buffer circuit 114 transmits data to be programmed to the bitlines, the data being received through the data input/output pins I/O and the data input/output buffer circuit 106. In response to the decoded column addresses Y-Add, the column gating circuit 116 transmits bitline data corresponding to a data input/output width, from among bitline data read by the sense amplifier and page buffer circuit 114, to the data input/output pins I/O through the data input/output buffer circuit 106.

Figure 2A:
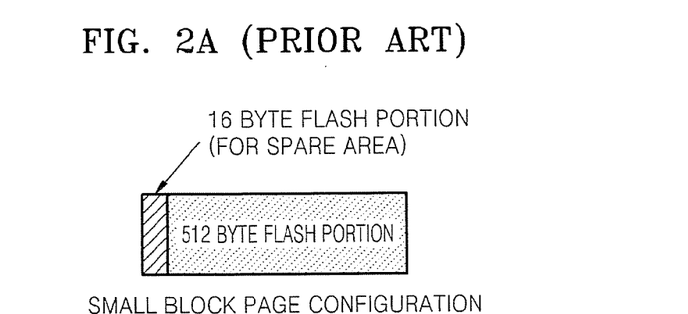
FIGS. 2A and 2B are diagrams illustrating page configurations in a memory cell array illustrated in FIG. 1.
Figure 2B:
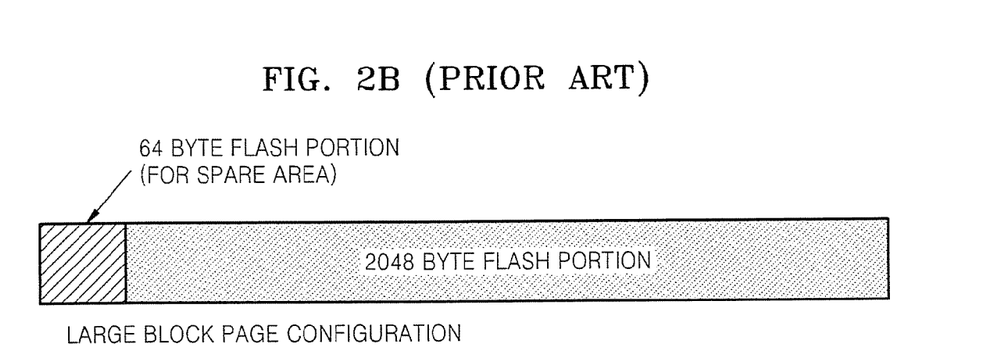

A page in the memory cell array 112 may have a small block page configuration as illustrated in FIG. 2A or a large block page configuration as illustrated in FIG. 2B. The small block page configuration shown in FIG. 2A includes a 512 byte flash cell portion and a 16 byte spare flash cell portion, and the large block page configuration shown in FIG. 2B includes a 2048 byte flash cell portion and a 64 byte spare flash cell portion.

In a reading operation of such a conventional NAND flash memory device 100 of FIG. 1, tens of microseconds (μs) may be consumed in establishing a read address, sense amplifying memory cell data corresponding to the read address, and storing the sense amplified memory cell data in the sense amplifier and page buffer circuit 114. This is largely because of the characteristics of a string type NAND flash cell. Accordingly, the NAND flash memory device 100 may consume a relatively large amount of time performing a random access reading operation.

SUMMARY OF THE INVENTION

In some embodiments of the present invention, a memory device includes a memory cell array including a NAND flash cell portion including a plurality of first columns of serially-connected flash memory cells and an non-volatile random access memory (NVRAM) cell portion including a plurality of second columns of NVRAM cells. The flash memory cells and the NVRAM cells are arranged such that respective word lines are connected to flash memory cells and NVRAM cells in each of respective rows, which may correspond to page units including flash memory cells and NVRAM cells.

In further embodiments, a spare area and/or a data area of the memory cell array includes NVRAM cells. The NVRAM cells of the memory cell array may include ferroelectric random access memory (FRAM) cells, magnetic random access memory (MRAM) cells or phase-change random access memory (PRAM) cells.

In some embodiments, the memory device further includes a first sense amplifier and page buffer circuit configured to receive data from the NVRAM cell portion and a second sense amplifier and page buffer circuit configured to receive data from the NAND flash cell portion. The device also includes a first column gating circuit coupled to the first sense amplifier and page buffer circuit and a second column gating circuit coupled to the second sense amplifier and page buffer circuit. A data input/output buffer circuit may be coupled between the first column gating circuit and the second column gating circuit. Control circuitry may be coupled to the NVRAM cell portion, the NAND flash cell portion, the first and second sense amplifier and page buffer circuits, the first and second column gating circuits and the data/input output buffer circuit and may be configured to support transfer of data from a NVRAM cell portion of a row through the first sense amplifier and page buffer circuit, the first column gating circuit and the data input/output buffer circuit concurrent with sensing and storing of data from a NAND flash cell portion of the row by the second sense amplifier and page buffer circuit. The control circuitry may be configured to support output of data from the NVRAM cell portion of the row via the data input/output buffer circuit simultaneous with transfer of data from the NAND flash cell portion of the row to the second sense amplifier and page buffer circuit.

In further embodiments of the present invention, a memory device includes a memory cell array including a NAND flash cell portion and an NVRAM cell portion arranged such that respective word lines are connected to flash memory cells and NVRAM cells in each of respective rows. The device also includes a row decoder circuit configured to selectively activate the word lines, a first sense amplifier and page buffer circuit configured to sense and amplify data on bitlines of the NVRAM cell portion and to store the sensed and amplified data and a second sense amplifier and page buffer circuit configured to sense and amplify data on bitlines in the NAND flash cell portion and to store the sensed and amplified data. A data input/output buffer circuit is configured to transmit data on an external input/output pin. A first column gating circuit is coupled between the first sense amplifier and page buffer circuit and the data input/output buffer circuit. A second column gating circuit is coupled between the second sense amplifier and page buffer circuit and the data input/output buffer circuit. A first column decoder circuit is configured to decode first column addresses and to responsively cause the first column gating circuit to selectively provide stored data from the first sense amplifier and page buffer circuit to the data input/output buffer circuit. A second column decoder circuit is configured to decode second column address and to responsively cause the second column gating circuit to selectively provide stored data from the second sense amplifier and page buffer circuit to the data input/output buffer circuit.

The device may further include control circuitry coupled to the row decoder circuit, the first column decoder circuit, the second column decoder circuit and the data input/output buffer circuit and configured to support transfer of data from a NVRAM cell portion of a row through the first sense amplifier and page buffer circuit, the first column gating circuit and the data input/output buffer circuit concurrent with sensing and storing data from a NAND flash cell portion of the row by the second sense amplifier and page buffer circuit. The circuitry may be configured to support output of data from the NVRAM cell portion of the row via the data input/output circuit simultaneous with transfer of data from the NAND flash cell portion of the row to the second sense amplifier and page buffer circuit.

In additional embodiments, the device further includes a write buffer circuit configured to store erase information and page information for the NAND flash cell portion. The write buffer circuit may include NVRAM cells and may have a capacity to store sufficient write data to fill a block of the memory cell array after an erasing operation on the NAND flash cell area. The device may further include a write buffer circuit controller configured to select a block and page to write the write data based on the erase information and the page information of the write buffer circuit. The write buffer circuit controller may be configured to write data in a NVRAM cell portion of a selected page before writing data to a NAND flash cell portion of the selected page.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being on, connected to and/or coupled to another element, the element may be directly on, connected and/or coupled to the other element, or intervening elements may be present. In contrast, when an element is referred to as being directly on, directly connected to and/or directly coupled to another element, no intervening elements are present. As used herein, the term "and/or" includes any and all combinations of one or more of the associated listed items.

It will also be understood that, although the terms first, second, etc., may be used herein to describe various elements, components and/or portions, these elements, components and/or portions should not be limited by these terms. Rather, these terms are used merely as a convenience to distinguish one element, component and/or portion from another element, component and/or portion. For example, a first element, component and/or portion could be termed a second element, component, region, layer and/or portion without departing from the teachings of the present invention.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprise," "comprising," includes, including, "have", "having" and variants thereof specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 3:
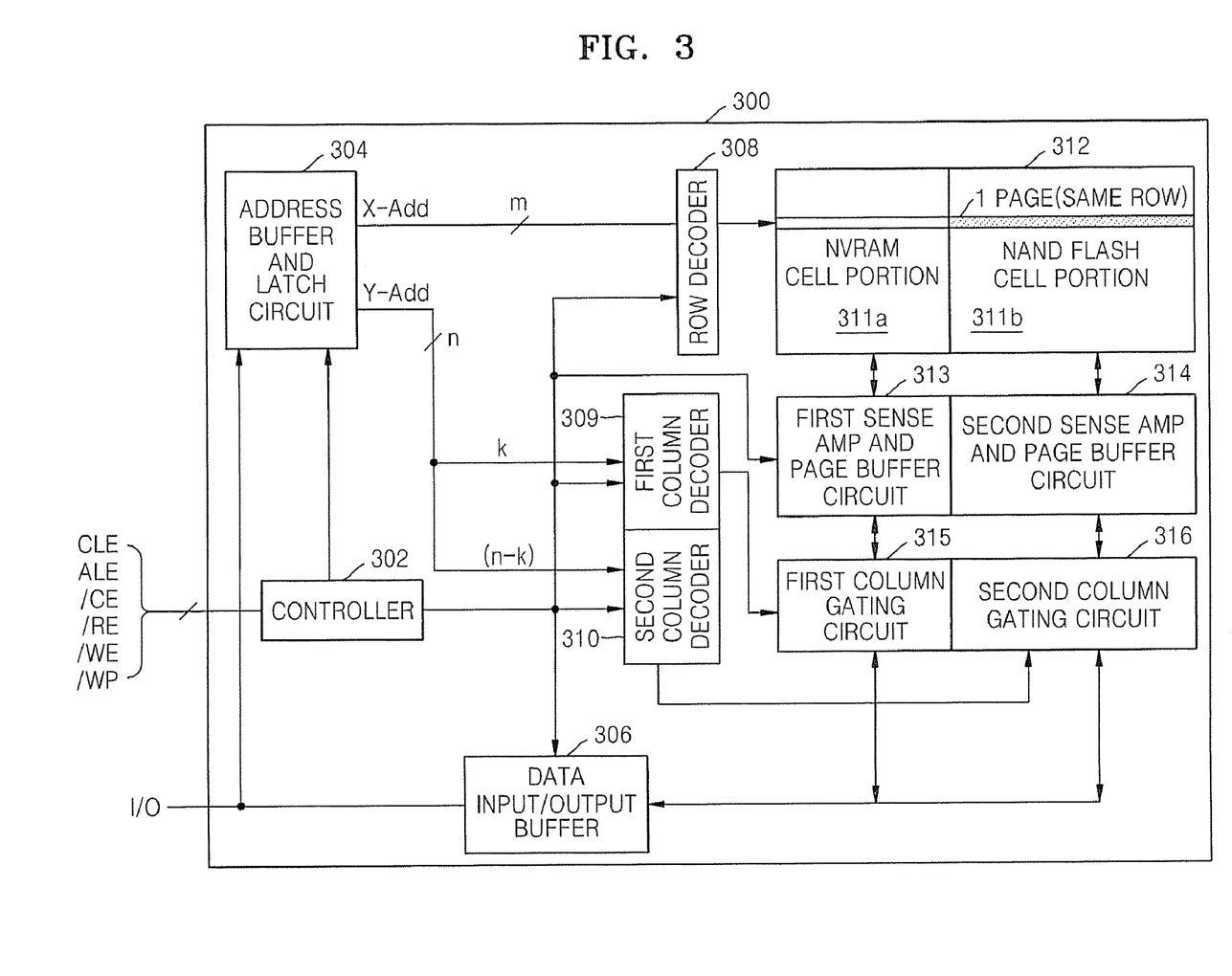
FIG. 3 is a block diagram illustrating a memory device according to some embodiments of the present invention.

FIG. 3 is a block diagram illustrating a memory device 300 according to some embodiments of the present invention. Referring to FIG. 3, the memory device 300 includes a controller 302, an address buffer circuit and latch circuit 304, a data input/output buffer circuit 306, a row decoder circuit 308, first and second column decoder circuits 309 and 310, a memory cell array 312, first and second sense amplifier and page buffer circuits 313 and 314, and first and second column gating circuits 315 and 316.

The controller 302 receives a plurality of control signals CLE, ALE, /CE, /RE, /WE, and /WP and generates mode control signals for controlling operations, such as a programming operation, an erasing operation, and a reading operation, of the memory device 300. In response to the mode control signals of the controller 302, the address buffer circuit and latch circuit 304 provides m bit row addresses X-Add and n bit column addresses Y-Add, which are received through data input/output pins I/O, respectively to the row decoder circuit 308 and the first and second column decoder circuit 309 and 310.

In response to the mode control signals of the controller 302, the row decoder circuit 308 decodes the m bit row addresses X-Add. In response to the mode control signals of the controller 302, the first column decoder circuit 309 decodes the k bit column addresses Y-Add, and the second column decoder circuit 310 decodes the n-k bit column addresses Y-Add.

The memory cell array 312 includes an NVRAM cell area 311a and a NAND flash cell area 311b. The NVRAM cell area 311a may include FRAM, PRAM, or MRAM cells arranged at crossing points of wordlines and bitlines. In the NAND flash cell area 311b, a plurality of memory cells connected in series to a bitline forms a string. Each wordline is connected to each of the plurality of memory cells, and a plurality of strings is arranged in rows and first columns. The memory cell array 312 is divided into page units based on NVRAM cells and flash cells connected to one wordline, and divided into blocks, each including a plurality of pages.

In response to the mode control signals of the controller 302, the first sense amplifier and page buffer circuit 313 sense amplifies bitline data of the NVRAM cell area 311a connected to the wordline of the memory cell array 312, the wordline selected during the reading operation, and stores the sense amplified data. The second sense amplifier and page buffer circuit 314 sense amplifies bitline data of the NAND flash cell area 311b connected to the selected wordline, and stores the sense amplified data.

In response to the k-bit column addresses Y-Add decoded in the first column decoder circuit 309, the first column gating circuit 315 transmits the bitline data read by the first sense amplifier and page buffer circuit 313 to data input/output pins I/O through the data input/output buffer circuit 306. In response to the n-k bit column addresses Y-Add decoded by the second column decoder circuit 310, the second column gating circuit 316 transmits the bitline data read by the second sense amplifier and page buffer circuit 314 to the data input/output pins I/O through the data input/output buffer circuit 306. The bitline data transmitted by the first and second column gating circuits 315 and 316 corresponds to data input/output width.

In the memory device 300, bitlines selected by the k bit column addresses Y-Add decoded in the page selected by the m bit row addresses X-Add decoded during the reading operation are in the NVRAM cell area 311a. NVRAM cells selected by the m bit row addresses X-add and the k bit column addresses Y-Add are output at a reading speed of the NVRAM cells, stored in the first sense amplifier and page buffer circuit 313, and transmitted to the data input/output pins I/O through the data input/output buffer circuit 306. The NAND flash cell area 311b that is on the same page at the time the NVRAM cell area 311a is selected and operated is also selected and operated. In other words, while a part of the data of the NVRAM cell area 311a is output to the data input/output pins I/O, the remaining part of the data of the NAND flash cell area 311b is amplified and stored by the second sense amplifier and page buffer circuit 314. After the data of the NVRAM cell area 311a is fully output to the data input/output pins I/O, the data of the NAND flash cell area 311b is output to the data input/output pins I/O.

Thus, in the memory device 300, when a page of the memory cell array 312 is selected, data of the NVRAM cell area 311a that can be quickly read is first read. Thus, tens of microseconds are not required, unlike a conventional flash memory device. A random reading speed of the memory device 300 can be improved to an access speed of an NVRAM.

The NVRAM cell area 311a of the memory cell array 312 uses a memory capacity to continuously output the data to the data input/output pins I/O during the time the NAND flash cell area 311b selects a memory cell, sense amplifies the data, and then stores the sense amplified data.

Figure 4A:
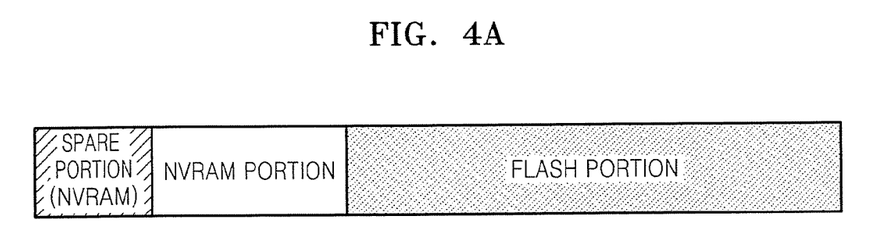
FIGS. 4A through 4C are diagrams illustrating page configurations in a memory cell array according to further embodiments of the present invention.
Figure 4B:
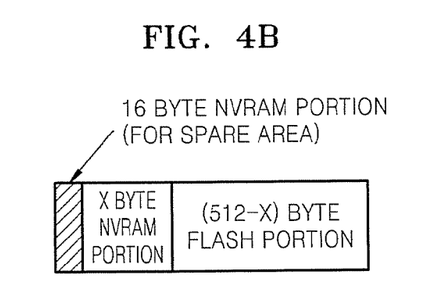
Figure 4C:
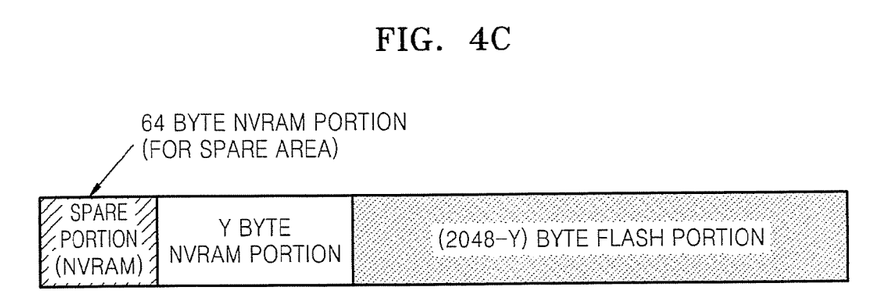

FIGS. 4A through 4C are diagrams illustrating page configurations for the memory cell array 312 illustrated in FIG. 3. Referring to FIG. 4A, one page is formed of a spare portion, an NVRAM portion, and a flash portion. The spare portion is formed of NVRAM cells. In detail, as illustrated in FIG. 4B, a small block page of 512 bytes includes a spare NVRAM portion of 16 bytes, an NVRAM portion of X bytes, and a flash portion of 512-X bytes. As illustrated in FIG. 4C, a large block page includes a spare NVRAM portion of 64 bytes, an NVRAM portion of Y bytes, and a flash portion of 2048-Y bytes.

Figure 5:
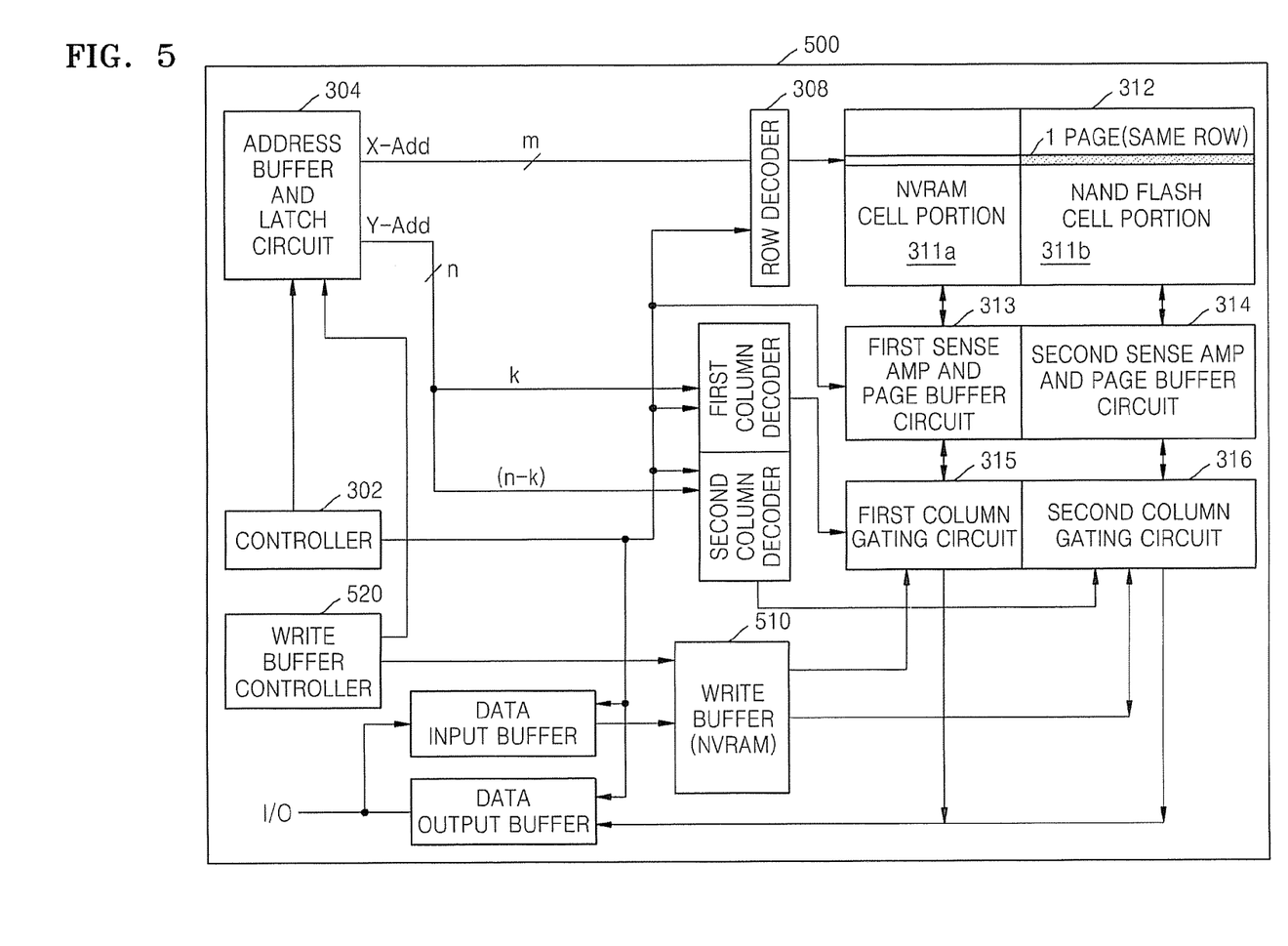
FIG. 5 is a block diagram illustrating a memory device according to additional embodiments of the present invention.

FIG. 5 is a block diagram illustrating a memory device 500 according to further embodiments of the present invention. Like elements in the flash memory device 500 and the flash memory device 300 of FIG. 3 are indicated by like numerals and will not be further described in lieu of the foregoing description of FIG. 3. Referring to FIG. 5, the memory device 500 includes a write buffer circuit 510 formed of NVRAM cells, and a write buffer circuit controller 520 controlling the write buffer circuit 510. As compared to the memory device 300 of FIG. 3, considering that since the memory device 300 performs a writing (or programming) operation according to a writing (or programming) method of the conventional flash memory device 100 of FIG. 1, a writing (or programming) speed may not be improved.

The write buffer circuit 510 stores erase information, such as an erasing frequency, and page information, such as address map data and write data, for the NAND flash cell area 311b. When write data of a certain address is input during a writing operation, the write buffer circuit 510 sequentially stores the write data, and the write buffer circuit controller 520 selects a block and page to write the write data by using the erase information and the page information of the write buffer circuit 510. If an erasing operation is not required, the NVRAM cell area 311a at an address of the selected page writes the write data, and the NAND flash cell area 311b at the address of the selected page prepares a writing operation, and performs the writing operation of the write data after the preparation is completed. If the erasing operation is required, the writing operation is performed after the erasing operation. Accordingly, it may be desirable that the capacity of the write buffer circuit 510 be larger than the capacity for storing all of the write data inputted during a sufficient time so as to perform all writing operations after the erasing operation. Such a writing operation may be established as an operation to be performed when a system in which the memory device 500 is installed, is in an idle state.

In a memory device according to some embodiments of the present invention, when a page of a memory cell array is selected, data is first read from or written to an NVRAM cell portion and then data is read from or written to a flash cell portion. In this manner, the memory device may provide increased random access read and write speeds in comparison to conventional flash memory devices.

While embodiments of the present invention have been particularly shown and described, it will be understood by one of ordinary skill in the art that various changes in form and details may be made therein without departing from the spirit and scope of the present invention as defined by the following claims.

What is claimed is:

1. A memory device comprising:
    a memory cell array comprising a NAND flash cell portion comprising a plurality of first columns of serially connected flash memory cells and an NVRAM cell portion comprising a plurality of second columns of NVRAM cells,
    wherein the flash memory cells and the NVRAM cells are arranged such that respective word lines are connected to flash memory cells and NVRAM cells in each of respective rows and wherein the respective rows correspond to respective page units including flash memory cells and NVRAM cells.

2. The memory device of claim 1, wherein a spare area and/or a data area of the memory cell array comprises NVRAM cells.

3. The memory device of claim 1, wherein the NVRAM cells comprise FRAM cells, MRAM cells or PRAM cells.

4. A memory device comprising:
    a memory cell array comprising a NAND flash cell portion comprising a plurality of first columns of serially connected flash memory cells and an NVRAM cell portion comprising a plurality of second columns of NVRAM cells, wherein the flash memory cells and the NVRAM cells are arranged such that respective word lines are connected to flash memory cells and NVRAM cells in each of respective rows;
    a first sense amplifier and page buffer circuit configured to receive data from the NVRAM cell portion;
    a second sense amplifier and page buffer circuit configured to receive data from the NAND flash cell portion;
    a first column gating circuit coupled to the first sense amplifier and page buffer circuit;
    a second column gating circuit coupled to the second sense amplifier and page buffer circuit;
    a data input/output buffer circuit coupled to the first column gating circuit and the second column gating circuit; and
    control circuitry coupled to the NVRAM cell portion, the NAND flash cell portion, the first and second sense amplifier and page buffer circuits, the first and second column gating circuits and the data/input output buffer circuit and configured to support transfer of data from a NVRAM cell portion of a row through the first sense amplifier and page buffer circuit, the first column gating circuit and the data input/output buffer circuit concurrent with sensing and storing of data from a NAND flash cell portion of the row by the second sense amplifier and page buffer circuit.

5. The memory device of claim 4, wherein the control circuitry is configured to support output of data from the NVRAM cell portion of the row via the data input/output buffer circuit simultaneous with transfer of data from the NAND flash cell portion of the row to the second sense amplifier and page buffer circuit.

6. A memory device comprising:
    a memory cell array comprising a NAND flash cell portion and an NVRAM cell portion arranged such that respective word lines are connected to flash memory cells and NVRAM cells in each of respective rows;
    a row decoder circuit configured to selectively activate the word lines;
    a first sense amplifier and page buffer circuit configured to sense and amplify data on bitlines of the NVRAM cell portion and to store the sensed and amplified data;
    a second sense amplifier and page buffer circuit configured to sense and amplify data on bitlines in the NAND flash cell portion and to store the sensed and amplified data;
    a data input/output buffer circuit configured to transmit data on an external input/output pin;
    a first column gating circuit coupled between the first sense amplifier and page buffer circuit and the data input/output buffer circuit;
    a second column gating circuit coupled between the second sense amplifier and page buffer circuit and the data input/output buffer circuit;
    a first column decoder circuit configured to decode first column addresses and to responsively cause the first column gating circuit to selectively provide stored data from the first sense amplifier and page buffer circuit to the data input/output buffer circuit; and
    a second column decoder circuit configured to decode second column addresses and to responsively cause the second column gating circuit to selectively provide stored data from the second sense amplifier and page buffer circuit to the data input/output buffer circuit.

7. The memory device of claim 6, wherein a spare portion and/or a data portion of the memory cell array comprises NVRAM cells.

8. The memory device of claim 6, wherein the NVRAM cell portion comprises FRAM cells, MRAM cells, or PRAM cells.

9. The memory device of claim 6, further comprising control circuitry coupled to the row decoder circuit, the first column decoder circuit, the second column decoder circuit and the data input/output buffer circuit and configured to support transfer of data from a NVRAM cell portion of a row through the first sense amplifier and page buffer circuit, the first column gating circuit and the data input/output buffer circuit concurrent with sensing and storing data from a NAND flash cell portion of the row by the second sense amplifier and page buffer circuit.

10. The memory device of claim 9, wherein the control circuitry is configured to support output of data from the NVRAM cell portion of the row via the data input/output circuit simultaneous with transfer of data from the NAND flash cell portion of the row to the second sense amplifier and page buffer circuit.

11. The memory device of claim 6, further comprising a write buffer circuit configured to store erase information and page information for the NAND flash cell portion.

12. The memory device of claim 11, wherein the write buffer circuit comprises NVRAM cells.

13. The memory device of claim 11, wherein the write buffer circuit has a capacity to store sufficient write data to fill a block of the memory cell array after an erasing operation on the NAND flash cell area.

14. The memory device of claim 11, further comprising a write buffer circuit controller configured to select a block and page to write the write data via the erase information and the page information of the write buffer circuit.

15. The memory device of claim 14, wherein the write buffer circuit controller is configured to write data in a NVRAM cell portion of a selected page before writing data to a NAND flash cell portion of the selected page.

* * * * *